(12) United States Patent
Gutman et al.

(10) Patent No.: US 11,502,708 B2
(45) Date of Patent: Nov. 15, 2022

(54) DIGITAL PRE-DISTORTER TRAINING

(71) Applicant: QUALCOMM Incorporated, San Diego, CA (US)

(72) Inventors: Igor Gutman, Ramat Gan (IL); Yehezkel Hadid, Kfar Saba (IL); Carl Hardin, Encinitas, CA (US); Sang-June Park, San Diego, CA (US); Mendel Menachem Aizner, Raanana (IL); Gideon Shlomo Kutz, Ramat Hasharon (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/230,111

(22) Filed: Apr. 14, 2021

(65) Prior Publication Data

US 2021/0328609 A1    Oct. 21, 2021

Related U.S. Application Data

(60) Provisional application No. 63/010,129, filed on Apr. 15, 2020.

(51) Int. Cl.
*H04B 1/04* (2006.01)
*H04B 1/62* (2006.01)

(52) U.S. Cl.
CPC .......... *H04B 1/0475* (2013.01); *H04B 1/62* (2013.01)

(58) Field of Classification Search
CPC ........ H04B 1/0475; H04B 1/62; H04B 1/005; H04B 7/0413
USPC .................. 375/229–232, 295–297
See application file for complete search history.

(56) References Cited

U.S. PATENT DOCUMENTS

| | | | | |
|---|---|---|---|---|
| 8,982,995 | B1* | 3/2015 | Van Cai | H04B 1/0475 375/297 |
| 10,673,475 | B1* | 6/2020 | Zhuo | H04B 7/0617 |
| 11,133,854 | B1* | 9/2021 | Pratt | H04B 7/0482 |
| 2010/0128764 | A1* | 5/2010 | Debaillie | H04L 27/368 375/220 |
| 2011/0270590 | A1* | 11/2011 | Aparin | H03F 1/3258 703/2 |
| 2012/0154038 | A1* | 6/2012 | Kim | H04L 27/2626 330/149 |

(Continued)

FOREIGN PATENT DOCUMENTS

WO    2018219466 A1    12/2018

OTHER PUBLICATIONS

International Search Report and Written Opinion—PCT/US2021/027561—ISA/EPO—dated Aug. 2, 2021.

*Primary Examiner* — Emmanuel Bayard
(74) *Attorney, Agent, or Firm* — Patterson + Sheridan, L.L.P.

(57) ABSTRACT

Certain aspects of the present disclosure provide techniques for training a digital pre-distorter (DPD) using real-time over-the-air transmissions and receptions by a user equipment (UE). A method for training the DPD generally includes transmitting a signal, generated by a transmitter front end, via a first port; sampling the signal, received over the air, at a second port; performing signal processing cleaning (e.g., synchronization, linear over-the-air channel estimation and equalization); calculating coefficients for a DPD; and configuring the DPD with the coefficients, for use in digitally pre-distorting subsequent transmissions.

26 Claims, 13 Drawing Sheets

(56) References Cited

U.S. PATENT DOCUMENTS

| | | | |
|---|---|---|---|
| 2015/0358039 A1* | 12/2015 | Xiong | H04B 1/62 375/297 |
| 2018/0131502 A1 | 5/2018 | Askar et al. | |
| 2019/0363742 A1* | 11/2019 | Megretski | G06F 16/221 |
| 2020/0067466 A1* | 2/2020 | Kushnir | H03F 3/245 |
| 2020/0169332 A1* | 5/2020 | Tervo | H04B 1/0475 |
| 2020/0395963 A1 | 12/2020 | Megretski et al. | |
| 2021/0075649 A1* | 3/2021 | Mahmood | H04L 25/03114 |

\* cited by examiner

DIGITAL PRE-DISTORTER TRAINING

PRIORITY CLAIM(S)

This application claims benefit of and the priority to U.S. Provisional Application No. 63/010,129, filed on Apr. 15, 2020, which is expressly incorporated by reference in its entirety as if fully set forth below and for all applicable purposes.

BACKGROUND

Field of the Disclosure

Aspects of the present disclosure relate to wireless communications, and more particularly, to techniques for training digital pre-distorters using real-time over-the-air transmissions and receptions.

Description of Related Art

Wireless communication systems are widely deployed to provide various telecommunication services such as telephony, video, data, messaging, broadcasts, etc. These wireless communication systems may employ multiple-access technologies capable of supporting communication with multiple users by sharing available system resources (e.g., bandwidth, transmit power, etc.). Examples of such multiple-access systems include 3rd Generation Partnership Project (3GPP) Long Term Evolution (LTE) systems, LTE Advanced (LTE-A) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems, to name a few.

These multiple access technologies have been adopted in various telecommunication standards to provide a common protocol that enables different wireless devices to communicate on a municipal, national, regional, and even global level. New radio (e.g., 5G NR) is an example of an emerging telecommunication standard. NR is a set of enhancements to the LTE mobile standard promulgated by 3GPP. NR is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL). To these ends, NR supports beamforming, multiple-input multiple-output (MIMO) antenna technology, and carrier aggregation.

However, as the demand for mobile broadband access continues to increase, there exists a need for further improvements in NR and LTE technology. Preferably, these improvements should be applicable to other multi-access technologies and the telecommunication standards that employ these technologies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide improved blind decoding and channel estimation (BD/CE) limitations and configuration of new radio (NR) physical downlink control channel (PDCCH) repetition.

Certain aspects of the subject matter described in this disclosure can be implemented in a method for wireless communication by a user equipment (UE). The method generally includes transmitting a signal, generated by a transmitter front end, via one or more radio frequency (RF) transmit elements; sampling the signal, received over the air, at one or more RF receive elements; calculating coefficients for a digital pre-distorter (DPD) based on samples and the transmitted signal; and configuring the DPD with the coefficients, for use in digitally pre-distorting subsequent transmissions.

Certain aspects of the present disclosure can be implemented in an apparatus for wireless communication by a UE. The apparatus generally includes a memory and at least one processor coupled to the memory, the memory and the at least one processor being configured to transmit a signal, generated by a transmitter front end, via one or more RF transmit elements; sample the signal, received over the air, at one or more RF receive elements; calculate coefficients for a DPD based on samples and the transmitted signal; and configure the DPD with the coefficients, for use in digitally pre-distorting sub sequent transmissions.

Certain aspects of the present disclosure can be implemented in an apparatus for wireless communication by a UE. The apparatus generally includes means for transmitting a signal, generated by a transmitter front end, via one or more RF transmit elements; means for sampling the signal, received over the air, at one or more RF receive elements; means for calculating coefficients for a DPD based on samples and the transmitted signal; and means for configuring the DPD with the coefficients, for use in digitally pre-distorting sub sequent transmissions.

Certain aspects of the present disclosure can be implemented in a computer readable medium having instructions stored thereon for transmitting a signal, generated by a transmitter front end, via one or more RF transmit elements; sampling the signal, received over the air, at one or more RF receive elements; calculating coefficients for a DPD based on samples and the transmitted signal; and configuring the DPD with the coefficients, for use in digitally pre-distorting subsequent transmissions.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

The following description and the appended figures set forth certain features for purposes of illustration.

BRIEF DESCRIPTION OF THE DRAWINGS

The appended figures depict certain features of the various aspects described herein and are not to be considered limiting of the scope of this disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Aspects of the present disclosure provide apparatus, methods, processing systems, and computer readable mediums for techniques for training digital pre-distorters (DPDs) using real-time over-the-air (OTA) transmissions, as received at a device under training (DUT). The OTA transmissions used for the training could be any waveform that has the same (or similar) characteristics as an actual signal processed by the device when deployed (a mission mode signal). For example, the waveform may be the same or similar to the mission mode signal in terms of bandwidth, power, and/or peak to average power ratio (PAPR) as a standard-defined reference signal or channel.

Introduction to Wireless Communication Networks

Figure 1:
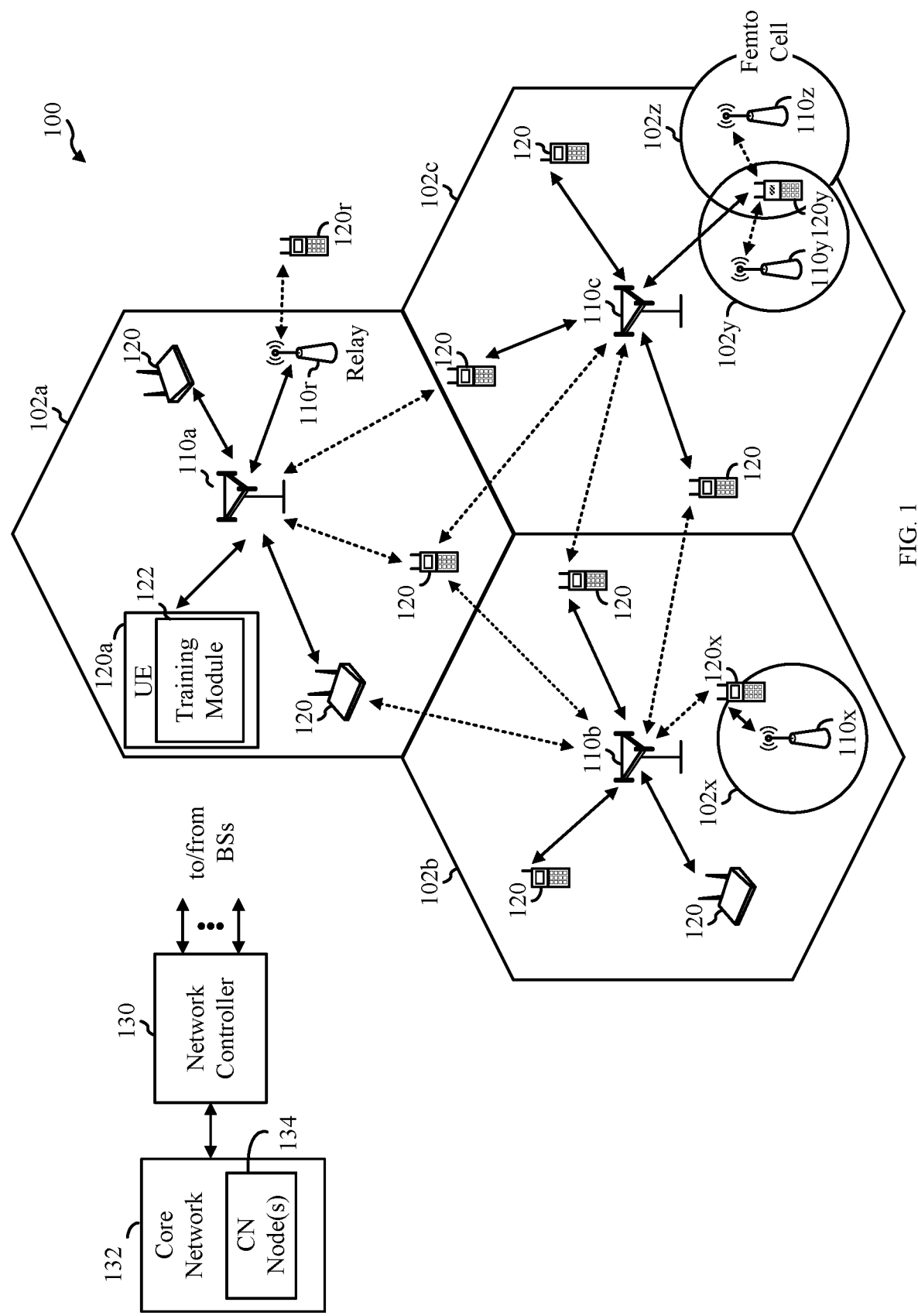
FIG. 1 is a block diagram conceptually illustrating an example telecommunications system, in accordance with certain aspects of the present disclosure.

FIG. 1 illustrates an example wireless communication network 100 in which aspects of the present disclosure may be performed.

For example, a UE 120a of the wireless communication network 100 includes a training module 122. The training module 122 may be configured to perform the operations illustrated in FIG. 7, as well as other operations disclosed herein for training digital pre-distorters using real-time over-the-air transmissions and receptions, in accordance with aspects of the present disclosure.

As shown in FIG. 1, the wireless communication network 100 may be in communication with a core network 132. The core network 132 may in communication with one or more base station (BSs) 110 and/or user equipment (UE) 120 in the wireless communication network 100 via one or more interfaces.

As illustrated in FIG. 1, the wireless communication network 100 may include a number of BSs 110a-z (each also individually referred to herein as BS 110 or collectively as BSs 110) and other network entities. A BS 110 may provide communication coverage for a particular geographic area, sometimes referred to as a "cell", which may be stationary or may move according to the location of a mobile BS 110. In some examples, the BSs 110 may be interconnected to one another and/or to one or more other BSs or network nodes (not shown) in wireless communication network 100 through various types of backhaul interfaces (e.g., a direct physical connection, a wireless connection, a virtual network, or the like) using any suitable transport network. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple cells. A network controller 130 may couple to a set of BSs 110 and provide coordination and control for these BSs 110 (e.g., via a backhaul).

The BSs 110 communicate with UEs 120a-y (each also individually referred to herein as UE 120 or collectively as UEs 120) in the wireless communication network 100. The UEs 120 (e.g., 120x, 120y, etc.) may be dispersed throughout the wireless communication network 100, and each UE 120 may be stationary or mobile. Wireless communication network 100 may also include relay stations (e.g., relay station 110r), also referred to as relays or the like, that receive a transmission of data and/or other information from an upstream station (e.g., a BS 110a or a UE 120r) and sends a transmission of the data and/or other information to a downstream station (e.g., a UE 120 or a BS 110), or that relays transmissions between UEs 120, to facilitate communication between devices.

Figure 2:
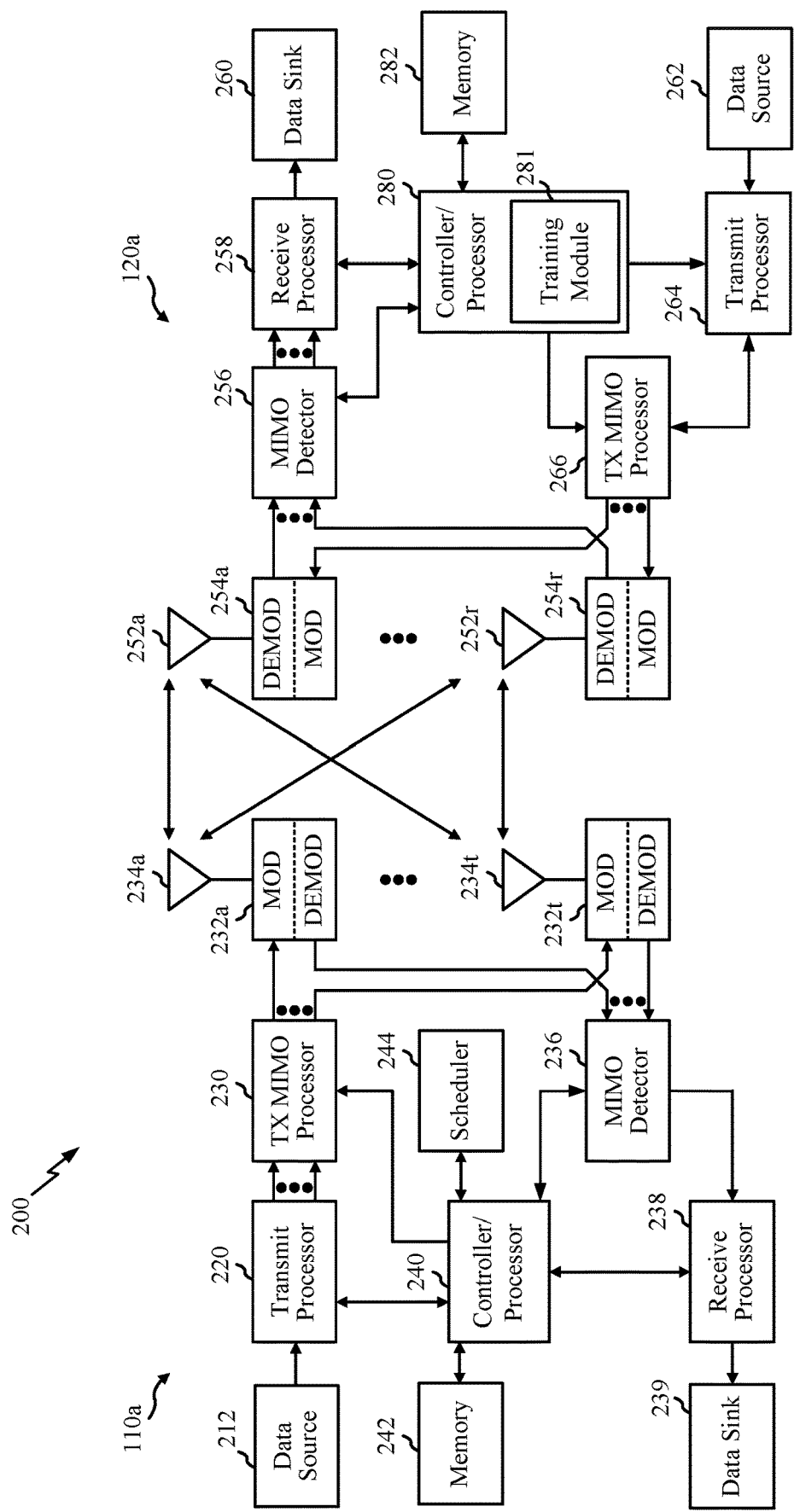
FIG. 2 is a block diagram conceptually illustrating a design of an example a base station (BS) and user equipment (UE), in accordance with certain aspects of the present disclosure.

FIG. 2 illustrates example components of BS 110a and UE 120a (e.g., in the wireless communication network 100 of FIG. 1), which may be used to implement aspects of the present disclosure.

At the BS 110a, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a physical downlink shared channel (PDSCH), a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), and channel state information reference signal (CSI-RS). A transmit (TX) multiple-input multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for OFDM, etc.) to obtain an output sample stream. Each modulator may further process (e.g., convert to analog, amplify, filter, and upconvert) the output sample stream to obtain a downlink signal. Downlink signals from modulators in transceivers 232a-232t may be transmitted via the antennas 234a-234t, respectively.

At the UE 120a, the antennas 252a-252r may receive the downlink signals from the BS 110a and may provide received signals to the demodulators (DEMODs) in transceivers 254a-254r, respectively. Each demodulator in transceivers 254a-254r may condition (e.g., filter, amplify, downconvert, and digitize) a respective received signal to obtain input samples. Each demodulator may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the modulators in transceivers 254a-254r (e.g., for SC-FDM, etc.), and transmitted to the BS 110a. At the BS 110a, the uplink signals from the UE 120a may be received by the antennas 234, processed by the modulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. A scheduler 244 may schedule UEs for data transmission on the downlink and/or uplink.

Antennas 252, processors 266, 258, 264, and/or controller/processor 280 of the UE 120a may be used to perform the various techniques and methods described herein for training digital pre-distorter using real-time over-the-air transmissions and receptions. For example, as shown in FIG. 2, the controller/processor 280 of the UE 120a includes training module 281 that may be configured to perform the operations illustrated in FIG. 7, as well as other operations disclosed herein for training a digital pre-distorter using real-time over-the-air transmissions and receptions, in accordance with aspects of the present disclosure. Although shown at the controller/processor 280, other components of the UE 120a may be used performing the operations described herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The minimum resource allocation, called a resource block (RB), may be 12 consecutive subcarriers. The system bandwidth may also be partitioned into subbands. For example, a subband may cover multiple RBs. NR may support a base subcarrier spacing (SCS) of 15 KHz and other SCS may be defined with respect to the base SCS (e.g., 30 kHz, 60 kHz, 120 kHz, 240 kHz, etc.).

Figure 3:
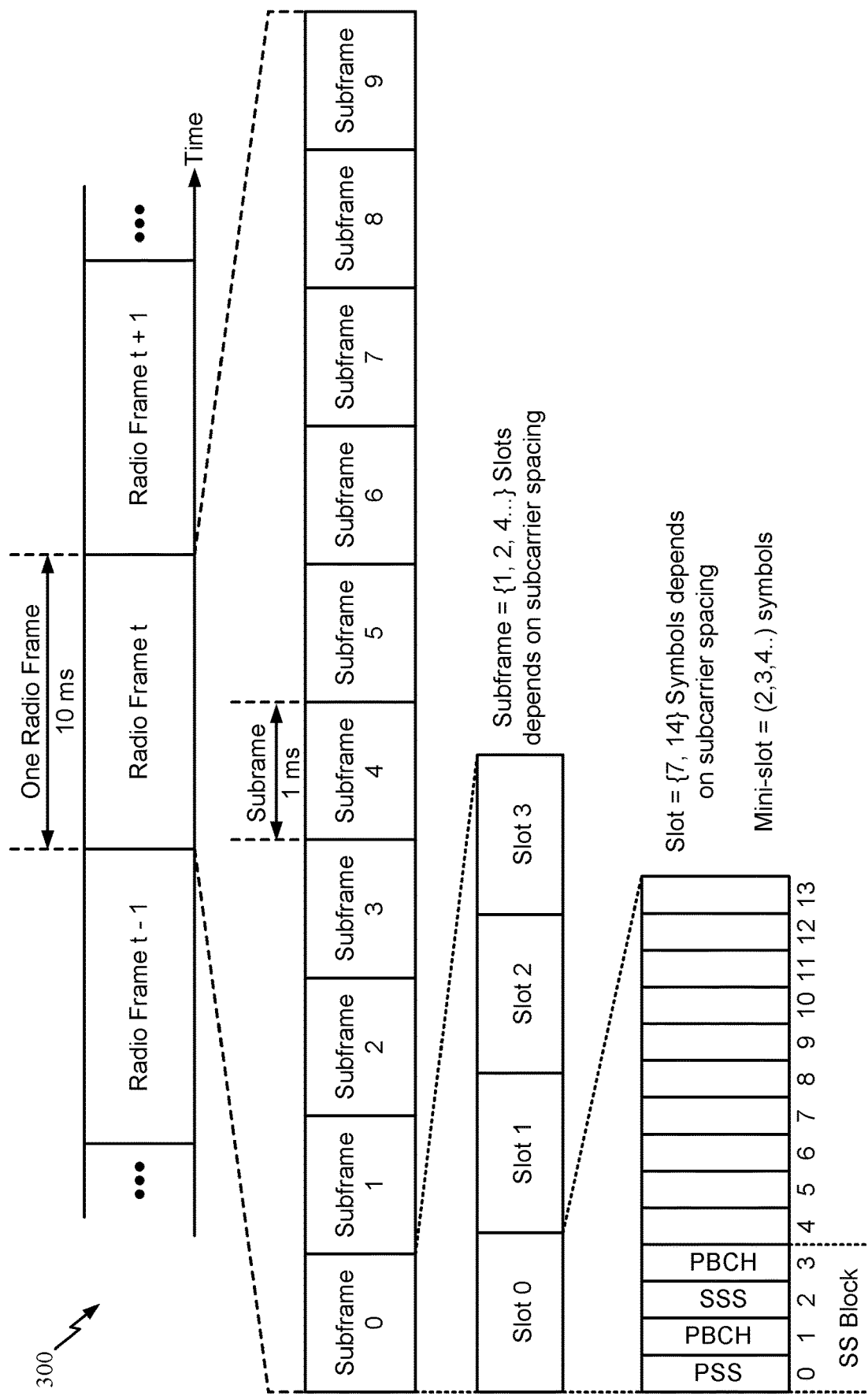
FIG. 3 is an example frame format for new radio (NR), in accordance with certain aspects of the present disclosure.

FIG. 3 is a diagram showing an example of a frame format 300 for NR. The transmission timeline for each of the downlink and uplink may be partitioned into units of radio frames. Each radio frame may have a predetermined duration (e.g., 10 ms) and may be partitioned into 10 subframes, each of 1 ms, with indices of 0 through 9. Each subframe may include a variable number of slots (e.g., 1, 2, 4, 8, 16, . . . slots) depending on the SCS. Each slot may include a variable number of symbol periods (e.g., 7 or 14 symbols)

depending on the SCS. The symbol periods in each slot may be assigned indices. A mini-slot, which may be referred to as a sub-slot structure, refers to a transmit time interval having a duration less than a slot (e.g., 2, 3, or 4 symbols).

Each symbol in a slot may indicate a link direction (e.g., DL, UL, or flexible) for data transmission and the link direction for each subframe may be dynamically switched. The link directions may be based on the slot format. Each slot may include DL/UL data as well as DL/UL control information.

In NR, a synchronization signal (SS) block (SSB) is transmitted. The SS block includes a PSS, a SSS, and a two symbol PBCH. The SS block can be transmitted in a fixed slot location, such as the symbols 0-3 as shown in FIG. 3. The PSS and SSS may be used by UEs for cell search and acquisition. The PSS may provide half-frame timing, and the SS may provide the CP length and frame timing. The PSS and SSS may provide the cell identity. The PBCH carries some basic system information, such as downlink system bandwidth, timing information within radio frame, SS burst set periodicity, system frame number, etc.

Further system information such as, remaining minimum system information (RMSI), system information blocks (SIBs), other system information (OSI) can be transmitted on a physical downlink shared channel (PDSCH) in certain subframes.

Figure 4:
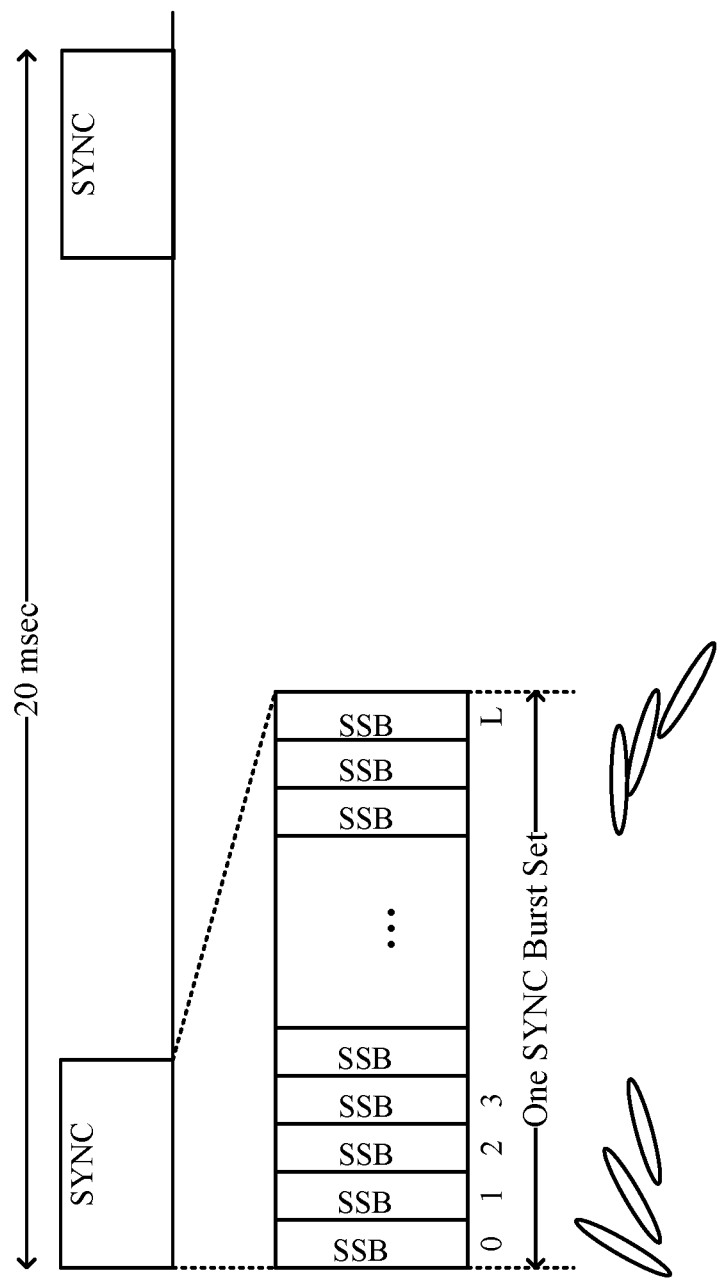
FIG. 4 illustrates how different synchronization signal blocks (SSBs) may be sent using different beams, in accordance with certain aspects of the present disclosure.

As shown in FIG. 4, the SS blocks may be organized into SS burst sets to support beam sweeping. As shown, each SSB within a burst set may be transmitted using a different beam, which may help a UE quickly acquire both transmit (Tx) and receive (Rx) beams (particular for mmW applications). A physical cell identity (PCI) may still decoded from the PSS and SSS of the SSB.

Certain deployment scenarios may include one or both NR deployment options. Some may be configured for non-standalone (NSA) and/or standalone (SA) option. A standalone cell may need to broadcast both SSB and remaining minimum system information (RMSI), for example, with SIB1 and SIB2. A non-standalone cell may only need to broadcast SSB, without broadcasting RMSI. In a single carrier in NR, multiple SSBs may be sent in different frequencies, and may include the different types of SSB.

Example Training a Digital Pre-Distorter Using Real-Time Over-the-Air Transmissions and Receptions Utilization efficiency of a resource, such as radiated power, plays a significant role in wireless communication systems. Some wireless communication systems include a transmitter with non-linear components, such as high-power amplifiers (PAs) with generally limited linear dynamic range. However, these non-linear components may distort the transmitted signal due to a relatively high peak-to-average power ratio (PAPR).

The non-linear distortions may be classified as in-band distortions or out-band distortions. In-band distortion affects link performance in the sense of mutual information and/or error vector magnitude (EVM). Out-band distortion dictates the amount of out of band (OOB) adjacent channel interference (ACI). ACI indicates how much the main transmission channel interferes with an adjacent channel.

Generally, to avoid non-linear distortions, power back-off (BO) is introduced. However the BO comes with a cost: the higher the BO, the lower the power efficiency. With a lower power efficiency, less power is transmitted to the medium, which can be problematic.

Another method to avoid non-linear distortions involves using a digital pre-distorter (DPD) in the transmitter's digital front end. Using the DPD, the amount of distortions may be kept at a target level, while the BO is reduced to be as low as possible, and hence the PA efficiency may be improved.

Because PAs are essential components in wireless communication systems, DPDs may be used to perform linearization on the nonlinear aspects of the PAs. DPDs feature linearization capabilities, preserve overall efficiency, and take advantage of advances in digital signal processors and analog to digital (A/D) converters. Generally, A DPD adds an expanding nonlinearity in the baseband that complements the compressing characteristics of the RF PA. Accordingly, the cascade of the DPD and the PA becomes linear and the original input is amplified by a constant gain. With the DPD, the PA may be used up to its saturation point while maintaining linearity and thus increasing efficiency. DPD may be considered as an "inverse" of the PA, and so the DPD may need to model PA behavior accurately and efficiently for successful DPD deployment.

Figure 5:
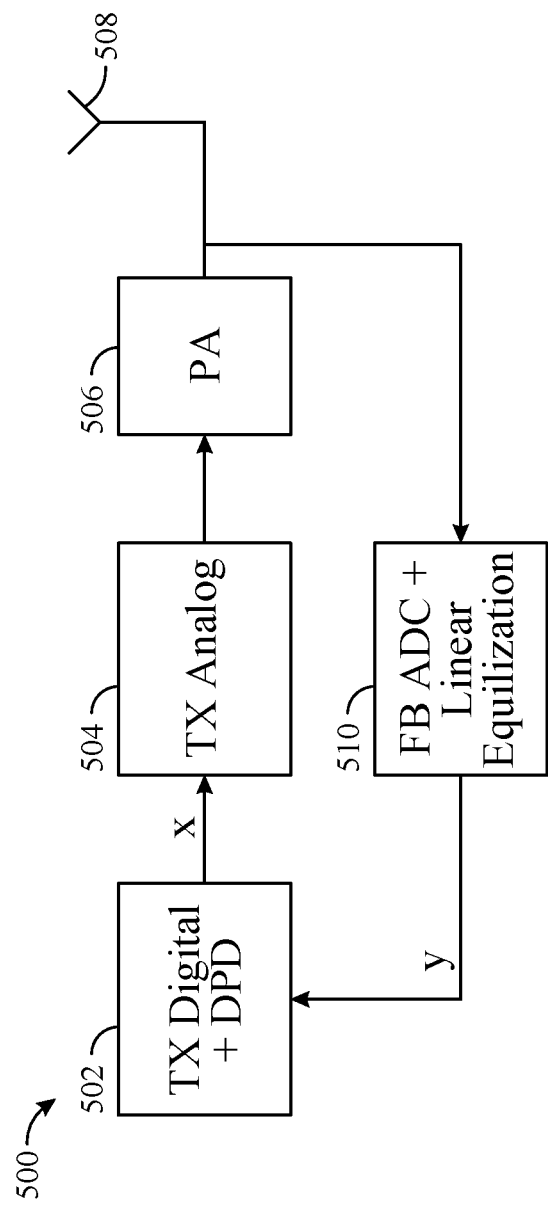
FIG. 5 shows an exemplary transmit chain, according to aspects of the present disclosure.

FIG. 5 illustrates an example transmit chain 500 having a DPD 502 within a UE. Generally, the UE generates a signal to transmit using a transmit chain to send the signal (as illustrated in FIG. 5). The signal starts in the digital domain before being converted to the analog domain by an analog converter 504 and being sent to a PA 506. The PA 506 sends the analog signal to the antenna 508 for transmission and to a dedicated feedback (FB) element (e.g., FB analog-to-digital converter (ADC)) and a linear equalizer 510. The FB element and the linear equalizer 510 may send the signal back to the DPD 502 for calculation of DPD coefficients. By using the transmitted signal for calculation of DPD coefficients, the calculated DPD coefficients may help with pre-distorting the signal to account for non-linear distortions.

One of the requirements for proper DPD performance is to have information regarding the PA non-linearity (NL) model. As mentioned, each transmit (TX) element may be endowed with a dedicated feedback (FB) element in an RF component (e.g., RF front end (RFFE)) (post PA), which allows for acquisition of the NL model and calculation of the DPD coefficients.

Generally, DPD training uses the following equations:

$$\underbrace{\begin{pmatrix} x(1) \\ x(2) \\ \dots \\ x(n) \end{pmatrix}}_{x} = \underbrace{\begin{pmatrix} y(1) & K_1(y(1)) & \dots & K_L(y(1)) \\ y(2) & K_1(y(2)) & \dots & K_L(y(2)) \\ \dots & \dots & \dots & \dots \\ y(n) & K_1(y(n)) & \dots & K_L(y(n)) \end{pmatrix}}_{Y} \cdot \underbrace{\begin{pmatrix} \alpha_1 \\ \alpha_2 \\ \dots \\ \alpha_L \end{pmatrix}}_{\alpha}$$

$$\alpha = (Y^H \cdot Y)^{-1} \cdot Y^H \cdot X$$

where elements of the a vector are DPD coefficients, elements of the x vector are the time domain (TD) samples of the transmitted pilot, elements of the y vector (e.g., the first column of the Y matrix) are the TD samples after equalization of linear channel. Further, Y is a matrix that consists of the non-linear kernels KL (with/without memory) (e.g., kernel $K_1$ may be $K_1(y(1))=y(1) \cdot |y(1)|^2$). While aspects of the present disclosure may apply DPD training using the above equations, there are other methods and/or equations that may be used to apply DPD calibration in accordance with the techniques disclosed herein.

Figure 6:
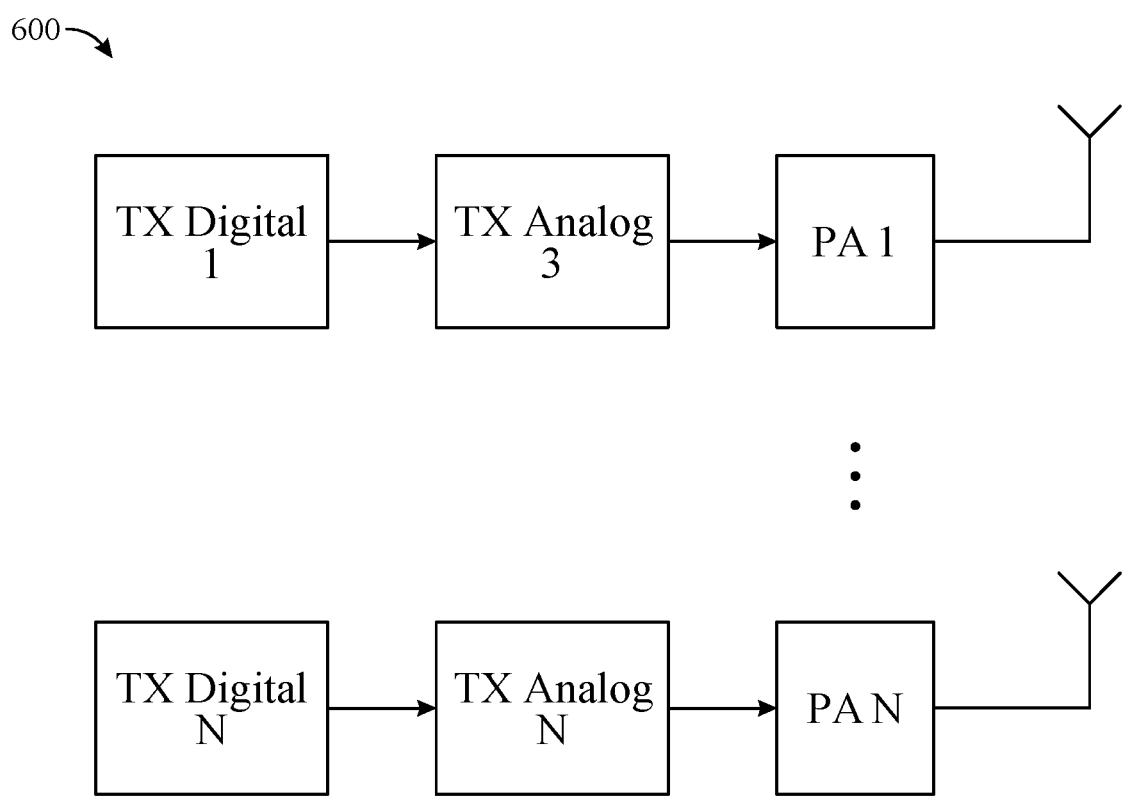
FIG. 6 shows an exemplary array of transmit chains, according to aspects of the present disclosure.

FIG. 6 illustrates an array 600 of TX elements within a UE. As shown in FIG. 6, the conventional approach would require a FB (e.g., FB ADC 1, FB ADC 2 (not shown), . . . , FB ADC N) per TX element, which in turn requires more physical space on the physical device itself. By removing the FB of each TX element in the array (e.g., as indicated by the "X" over each FB of each TX elements in FIG. 6), the physical footprint of each TX can be reduced and thus more TX elements can fit onto the physical device.

Aspects of the present disclosure, however, propose training DPDs using real-time over-the-air transmissions and receptions. Training the DPDs enables use of the DPD for the mmW range without requiring expensive hardware for feedback.

Figure 7:
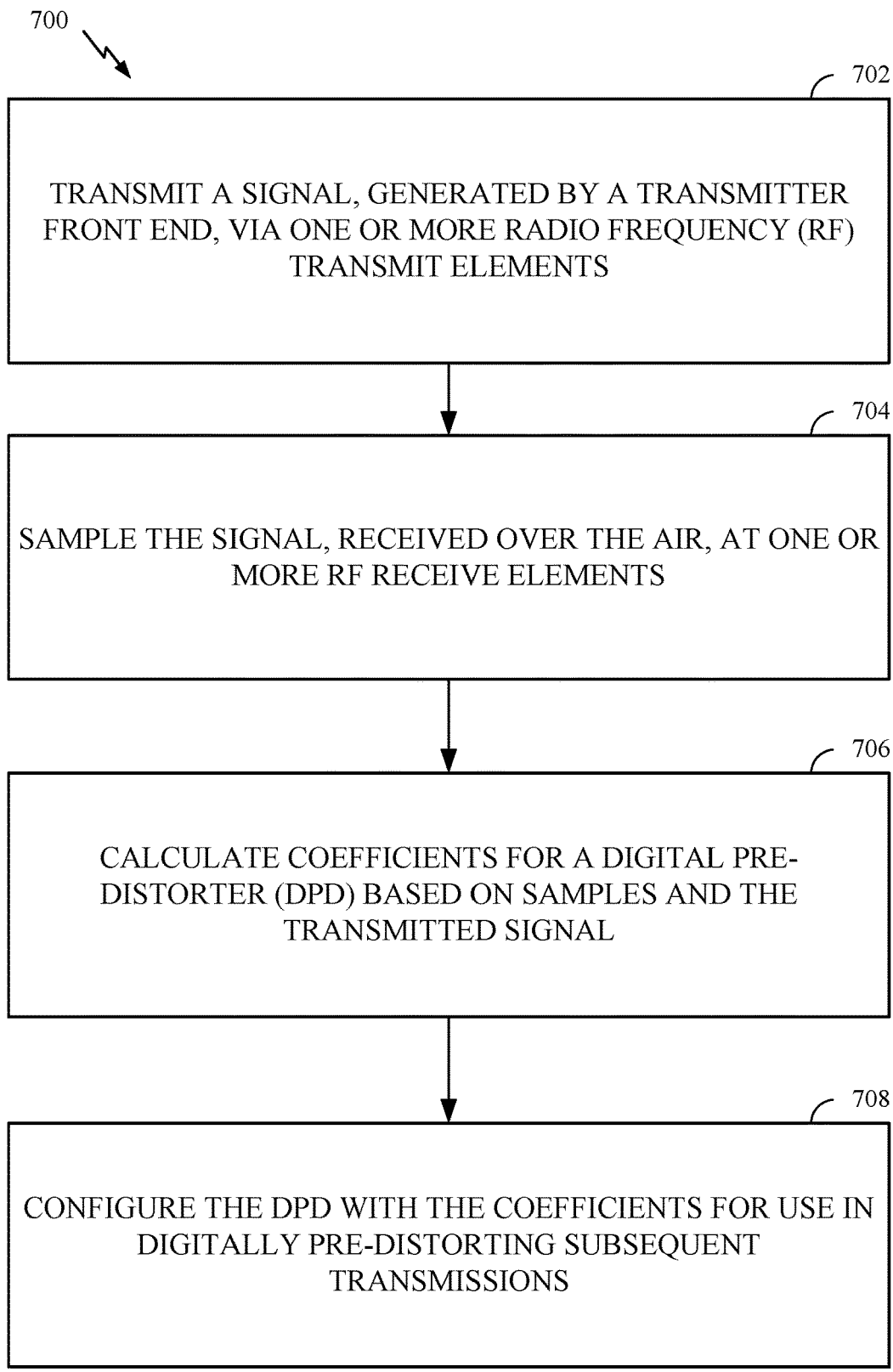
FIG. 7 illustrates example operations for wireless communication by a UE, according to aspects of the present disclosure.

FIG. 7 is a flow diagram illustrating example operations 700 for wireless communication, in accordance with certain aspects of the present disclosure. The operations 700 may be performed, for example, by UE (e.g., such as a UE 120a in the wireless communication network 100) for training DPDs using real-time over-the-air transmissions and receptions. The operations 700 may be implemented as software components that are executed and run on one or more processors (e.g., controller/processor 280 of FIG. 2). Further, the transmission and reception of signals by the UE in operations 700 may be enabled, for example, by one or more antennas (e.g., antennas 252 of FIG. 2). In certain aspects, the transmission and/or reception of signals by the UE may be implemented via a bus interface of one or more processors (e.g., controller/processor 280, including the training component 281) obtaining and/or outputting signals.

Operations 700 begin, at 702, by transmitting a signal, generated by a transmitter front end, via a one or more radio frequency (RF) transmit elements.

As noted above, the signal could be any waveform that has the same or similar characteristics (e.g., in terms of bandwidth, power, and/or PAPR) as a signal the device under test (e.g., a UE) will likely process in normal operation. In some cases, an actual standard-defined reference signal or channel could be used.

At 704, the UE samples the signal, received over the air, at one or more RF receive elements.

At 706, the UE calculates coefficients for a digital pre-distorter (DPD) based on samples and the transmitted signal.

At 708, the UE configures the DPD with the coefficients for use in digitally pre-distorting subsequent transmissions.

As discussed above, aspects of the present disclosure provide techniques to estimate DPD coefficients using existing hardware. By estimating DPD coefficients based on over the air (OTA) measurements, the DPD may be trained in an mmW UE without requiring expensive physical hardware for feedback. Aspects of the present disclosure also may help with validating the performance of the DPD using hardware.

Figure 8:
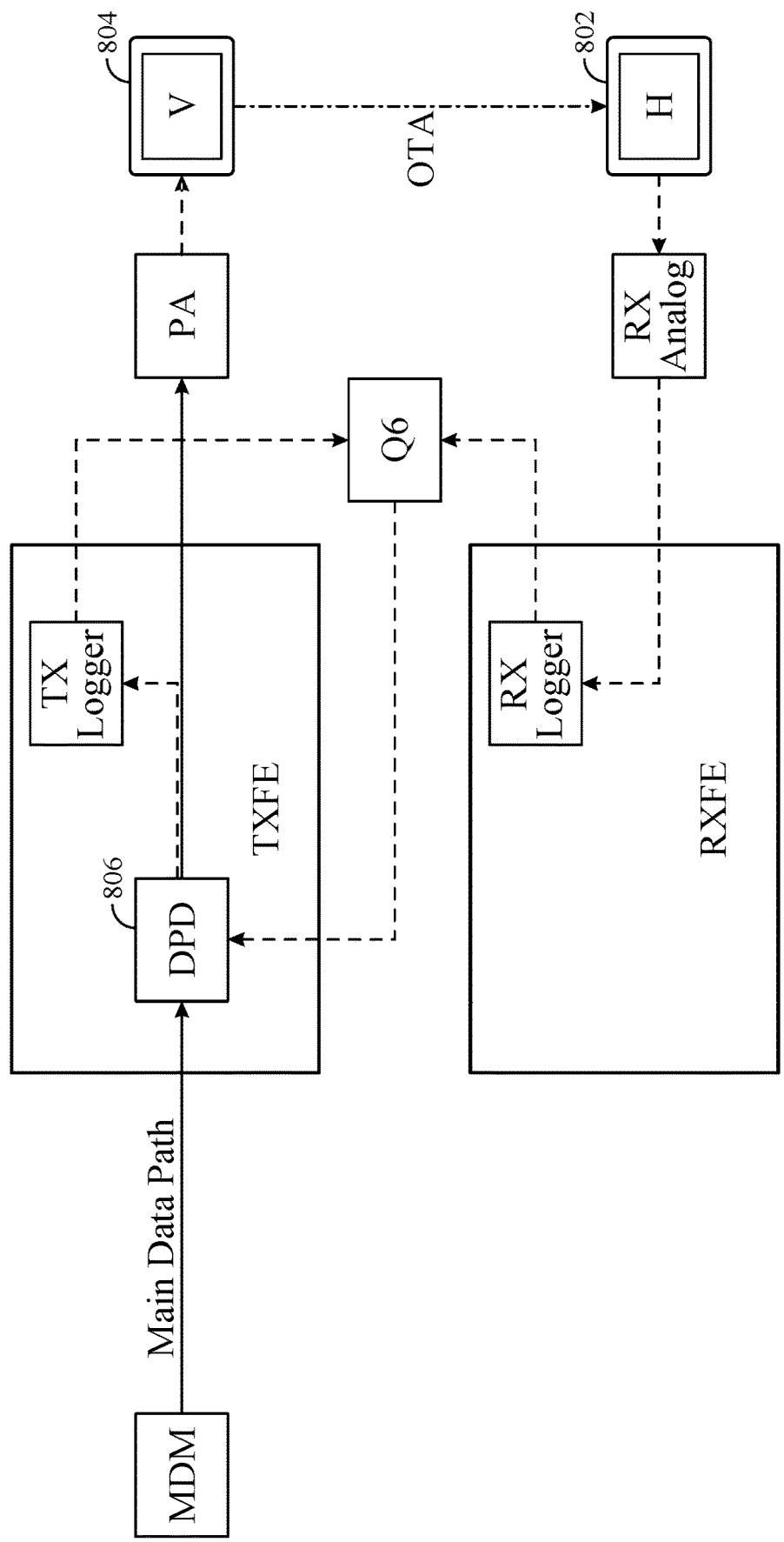
FIG. 8 illustrates an example communications system for training a digital pre-distorter, according to aspects of the present disclosure.

FIG. 8 illustrates an example of a configuration to estimate DPD coefficients according to aspects of the present disclosure. According to aspects of the present disclosure, orthogonal (or near orthogonal) antenna ports, such as horizontal (H) ports 802 and the vertical (V) ports 804 may be configured for OTA measurements. For example, as illustrated, the V ports 804 may be configured for Tx and the H ports 802 may be configured for Rx, or vice versa. In some cases, the V ports 804 and the H ports 802 may each comprise any number of transmission elements (e.g., TX chains, RX chains) and each transmission element comprises a PA.

Because the H ports 802 and the V ports 804 are likely not completely and/or fully orthogonal, some leakage may exist. By transmitting the signal from the V ports 804 and by receiving the parasitic leakage of the V ports 804 on the H ports 802, samples of the signal from the V port and from the H port may be compared to train the DPD 806. By training the DPD 806, the performance of the DPD 806 may be adjusted to account for the parasitic leakage between the H ports 802 and V ports 804.

In this example, a pair of elements may be selected: one of X elements in a vertical (V) array and one of Y elements in a horizontal (H) array. This pair selection may be accomplished based on various methods and/or criteria. As an example, the pair selection may be based on (an evaluation of) a predefined list of the elements/pairs (e.g., predefined per product by offline analysis). As another example, the pair selection may be based on a factory calibration (e.g., among all X-Y pairs) and a pair which has a sufficiently good link budget (e.g., the best among evaluated pairs) that does not saturate the receiver may be selected).

In some cases, DPD training may be used for transmissions and receptions using a single port but different RF elements of that port. For example, because a port may include an array of RF elements, a RF element of one port may be configured for TX and another RF element of the same port may be configured for RX. Accordingly, transmissions and receptions between these elements may be used for DPD training if the RF elements are orthogonal to each other. The orthogonality of the RF elements can assist in avoiding compressing of the RX signal.

Figure 9:
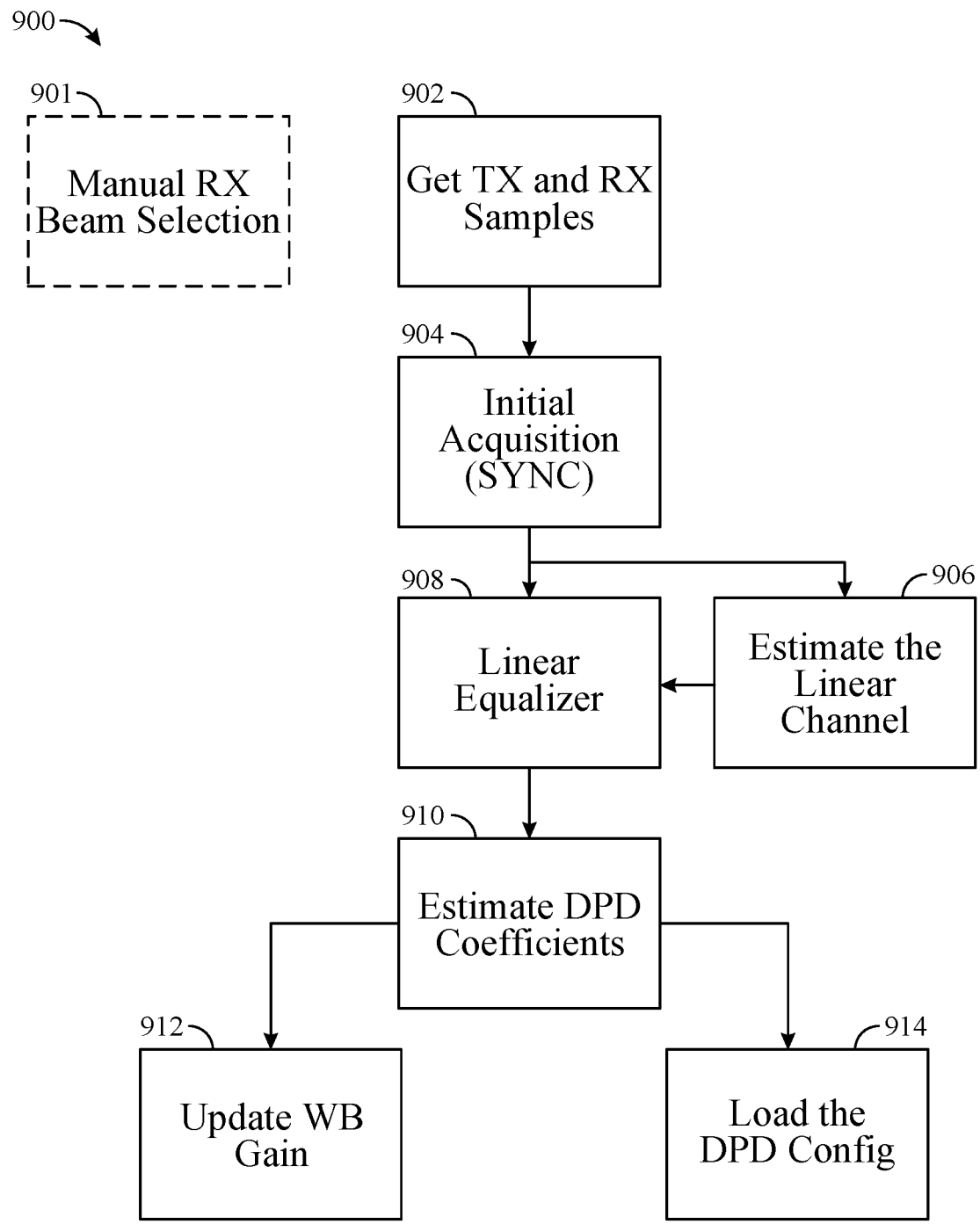
FIG. 9 is a flow diagram of the operations for training a digital pre-distorter, according to aspects of the present disclosure.

FIG. 9 is a flow diagram of operations 900 to train a DPD (e.g., the DPD 806 of FIG. 8) using OTA transmissions. Prior to training the DPD, some aspects involve finding the best RX beam that scales the OTA signals to decibels relative to full scale (dBFs), as shown at 901. In some aspects of training the DPD, the UE samples, at 902, the signal transmitted using the V ports using the transmitter front end (TXFE) logger. The UE also samples the real-time over-the-air (OTA) signal received from the V ports using the H ports using the RXFE logger. The UE synchronizes the samples and sends the synchronized samples to memory from the TXFE logger and the RXFE logger. In some cases, the UE performs an initial acquisition, at 904, to synchronize the samples received using the H ports and the samples transmitted using the V ports.

As noted above, more generally the signal could be any waveform that has the same or similar characteristics as a signal the device under test will likely process in normal operation. In some cases, rather than an arbitrary signal, a signal for DPD training may be transmitted with (piggybacked on) an actual standard-compliant reference signal or channel.

In some aspects, the UE estimates, at 906, the time domain coefficients of the OTA linear channel between the V ports and the H ports. The UE may perform TD linear equalization, at 908, to remove the OTA linear channel. The UE may update the digital gain with the DPD trained with the estimated DPD coefficients, so the power of the signal is about the same as the power of the signal without a DPD.

Using the synchronized samples in memory, the UE estimates the DPD coefficients, at 910, based on the DPD equations discussed above. In some cases, the UE then trains the DPD using the estimated DPD coefficients. The UE then, at 912, updates the UE updates the wideband (WB) gain, and, at 914, loads a DPD configuration.

Figure 10:
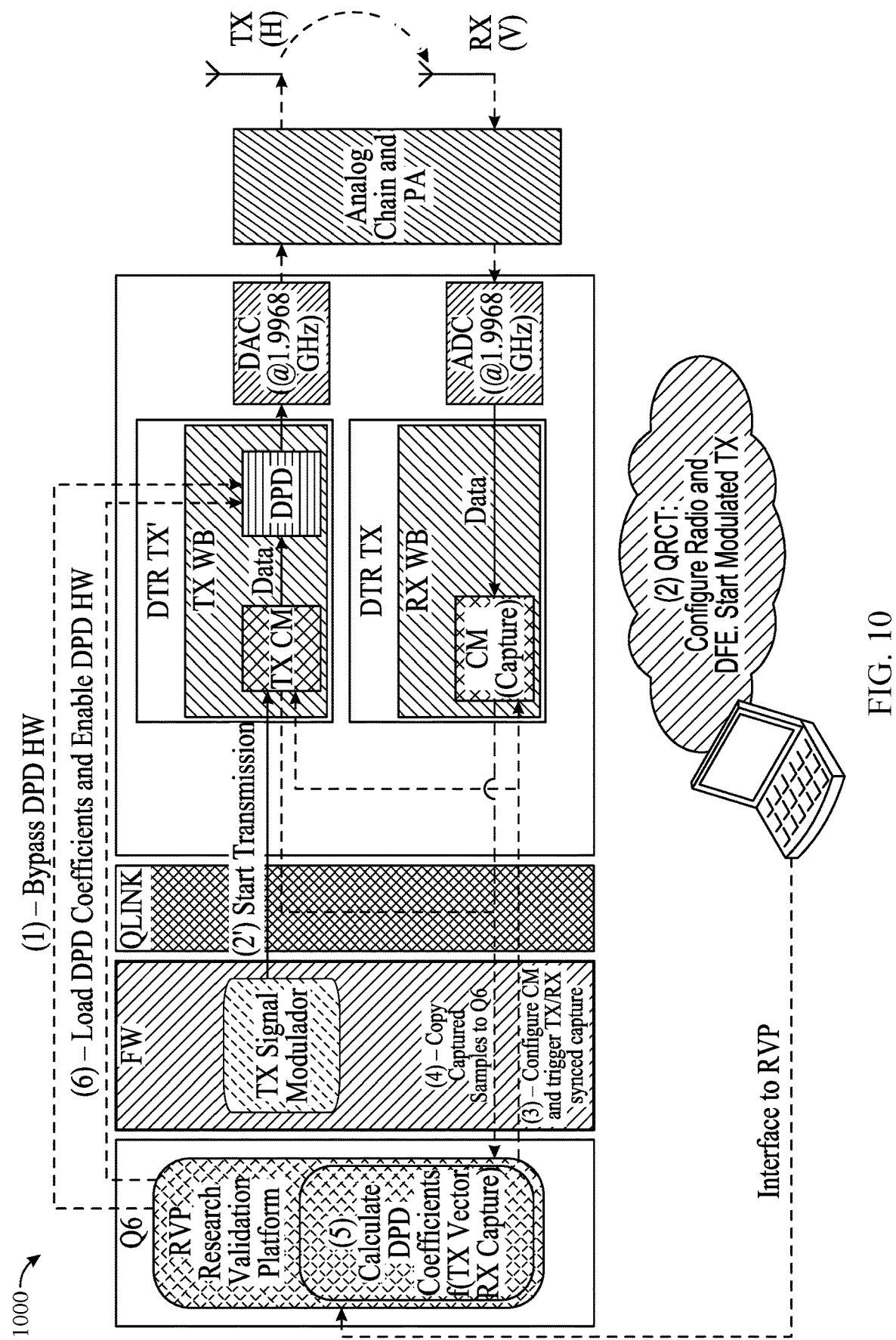
FIG. 10 illustrates operations in an example communications systems for training a digital pre-distorter, according to aspects of the present disclosure.

FIG. 10 illustrates an example training scenario 1000 and lists an example order of operations with reference to elements of a modem of a UE.

First, as illustrated, the signal bypasses the DPD hardware because the DPD has not been configured with DPD coefficients. Second, a processor may configure the radio and digital front end (DFE) and start a modulated transmission. The UE initiates transmission using the TX signal modulator, and the signal passes through the DFE (comprising a TX capture module (CM) and a DPD), a DAC, and an analog chain and PA to the transmit antenna. The signal is transmitted from the transmit ports (e.g., ANT0 TX) to the receive ports (e.g., ANT1 RX) before going back through the analog chain and PA, ADC, DFE (comprising a CM). Third, the UE configures the CM and triggers TX/RX synced capture of the signal. Fourth, the captured samples of the signals are copied to the research validation platform (RVP). Fifth, the RVP calculates DPD coefficients based on the captured samples. Sixth, the RVP loads the calculated DPD coefficients to the DPD and enables the DPD hardware.

As mentioned, the method involves no or little physical feedback between the V port and the H port. In some cases, the method involves powering down a low noise amplifier (LNA) of the RX port or the full RX chain. In this regard, powering down the LNA could prevent unintentional damage to the RX chain. The method may also involve injecting external interference directly to RX LNA, which may distort the signal received by the H ports and may not allow the DPD to be trained using the OTA feedback (FB).

The non-linear characteristics of the power amplifiers may be the same for each TX and/or receive element. The UE may train the array of TX and/or RX elements with the same or similar non-linear characteristics because beam configuration does not influence the array non-linearity. In some cases, the UE may perform a single iteration of DPD training and estimation.

Implementing aspects of the present disclosure may extend the cell edge (quadrature phase shift keying (QPSK)) by 1+dB without losing EVM or out-of-band (OOB) emissions, extend the 16 quadrature amplitude modulation (QAM) operational circle by ~2+dB, and/or extend the 64 QAM operational circle by 3+dB.

Figure 11:
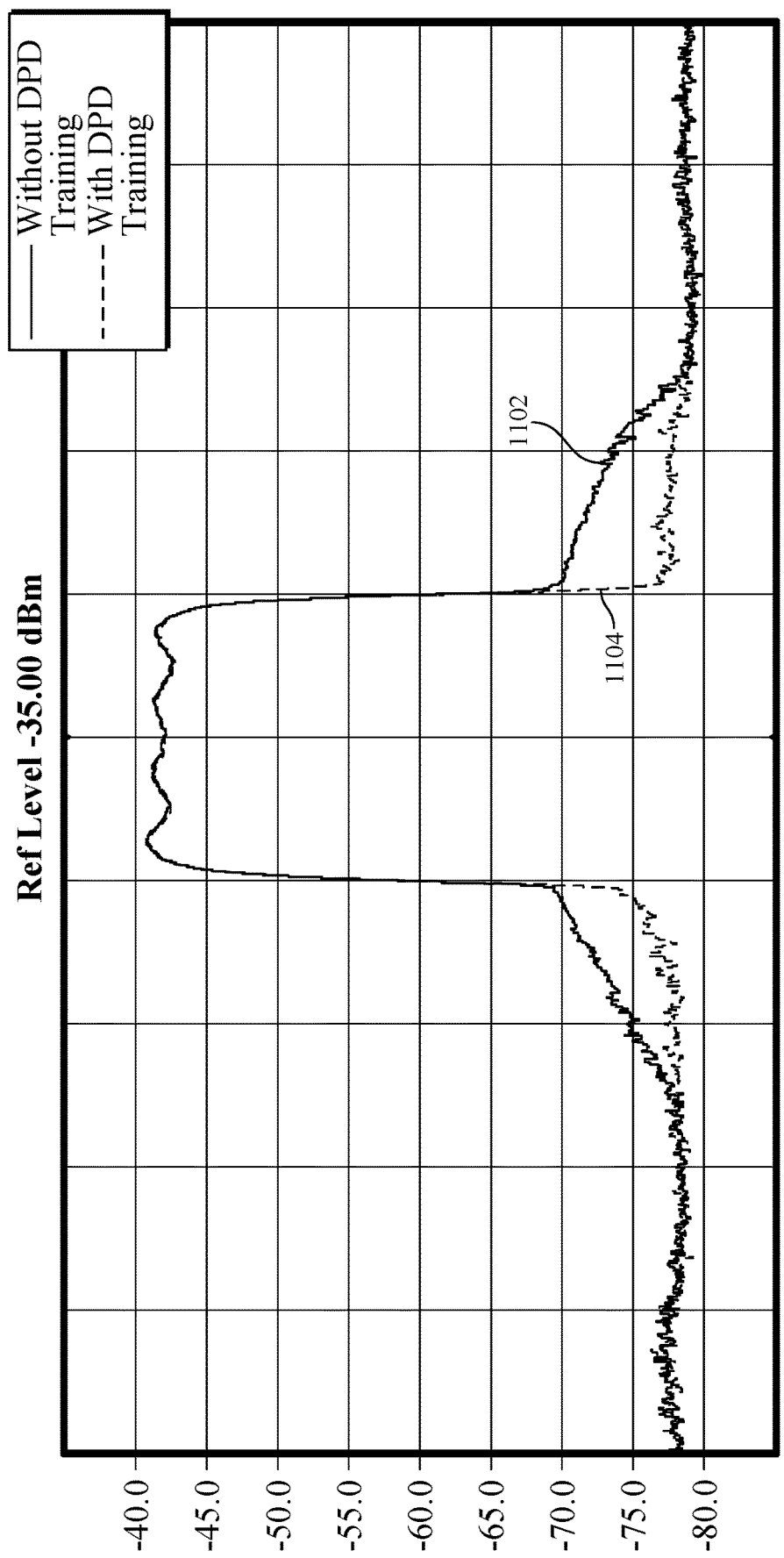
FIG. 11 illustrates digital pre-distorter performance with and without training, according to aspects of the present disclosure.

FIG. 11 illustrates DPD performance with and without training, according to aspects of the present disclosure. The line 1102 illustrates performance without a DPD, and shows the out-of-band distortion without the DPD. The line 1104 illustrates performance with DPD training, and shows that with the DPD, the out-of-band distortion is reduced as compared to the out-of-band distortion without a DPD. Accordingly, the DPD can significantly reduce the non-linearity of the PA and its effects on performance.

Figure 12:
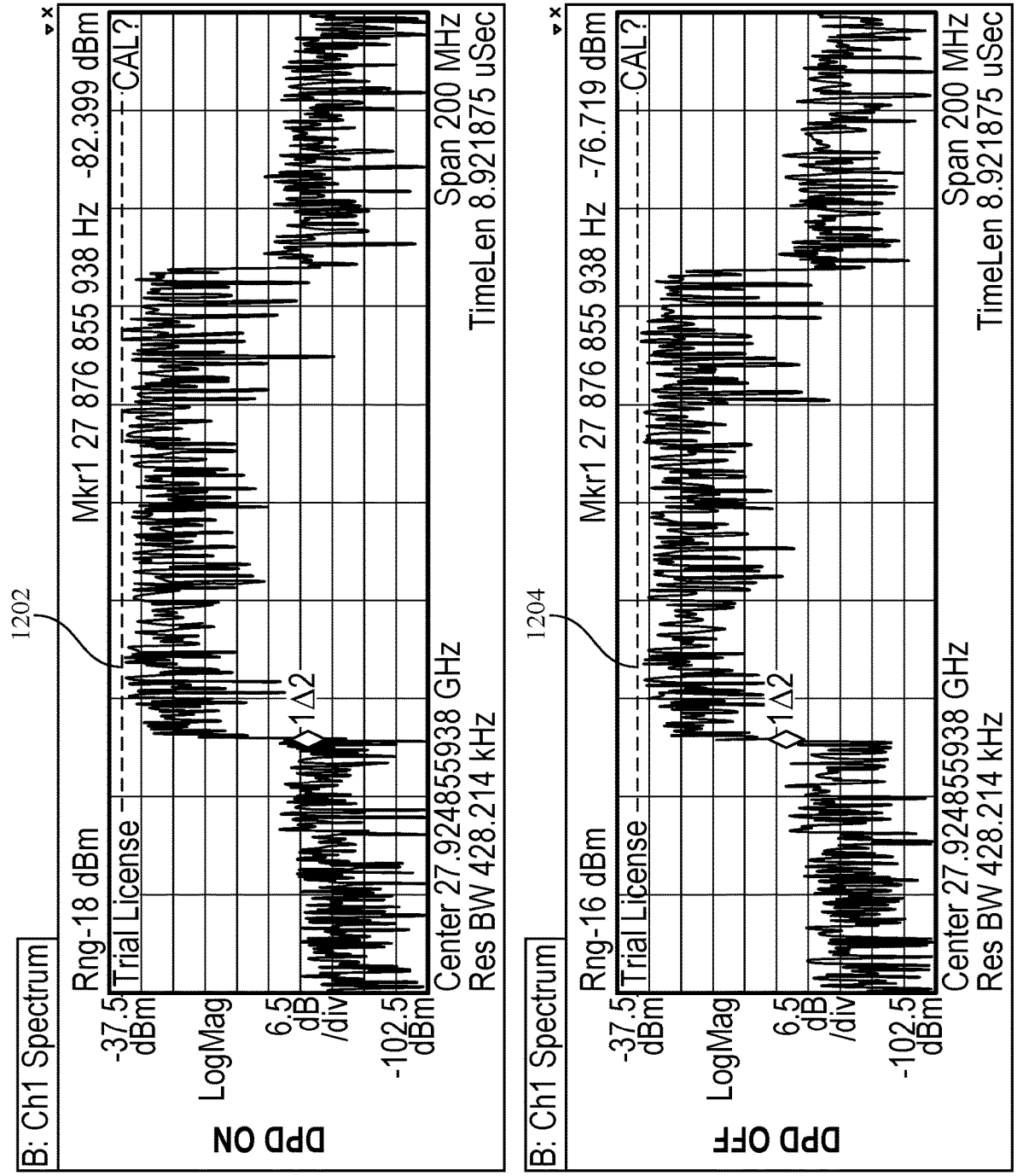
FIG. 12 illustrates error vector magnitude measurements with and without digital pre-distorter, according to aspects of the present disclosure.

FIG. 12 illustrates performance with and without training the DPD, according to aspects of the present disclosure. An improvement of 2.4 dB is seen, when comparing the peak values 1202 (e.g., −52.35 dB when DPD training is used) and 1204 (e.g., −54.7 dB when no DPD training is used) indicated by dashed lines, in the power outputted from the transmit antenna between the performance of the DPD with and without training.

Example Communications Device

Figure 13:
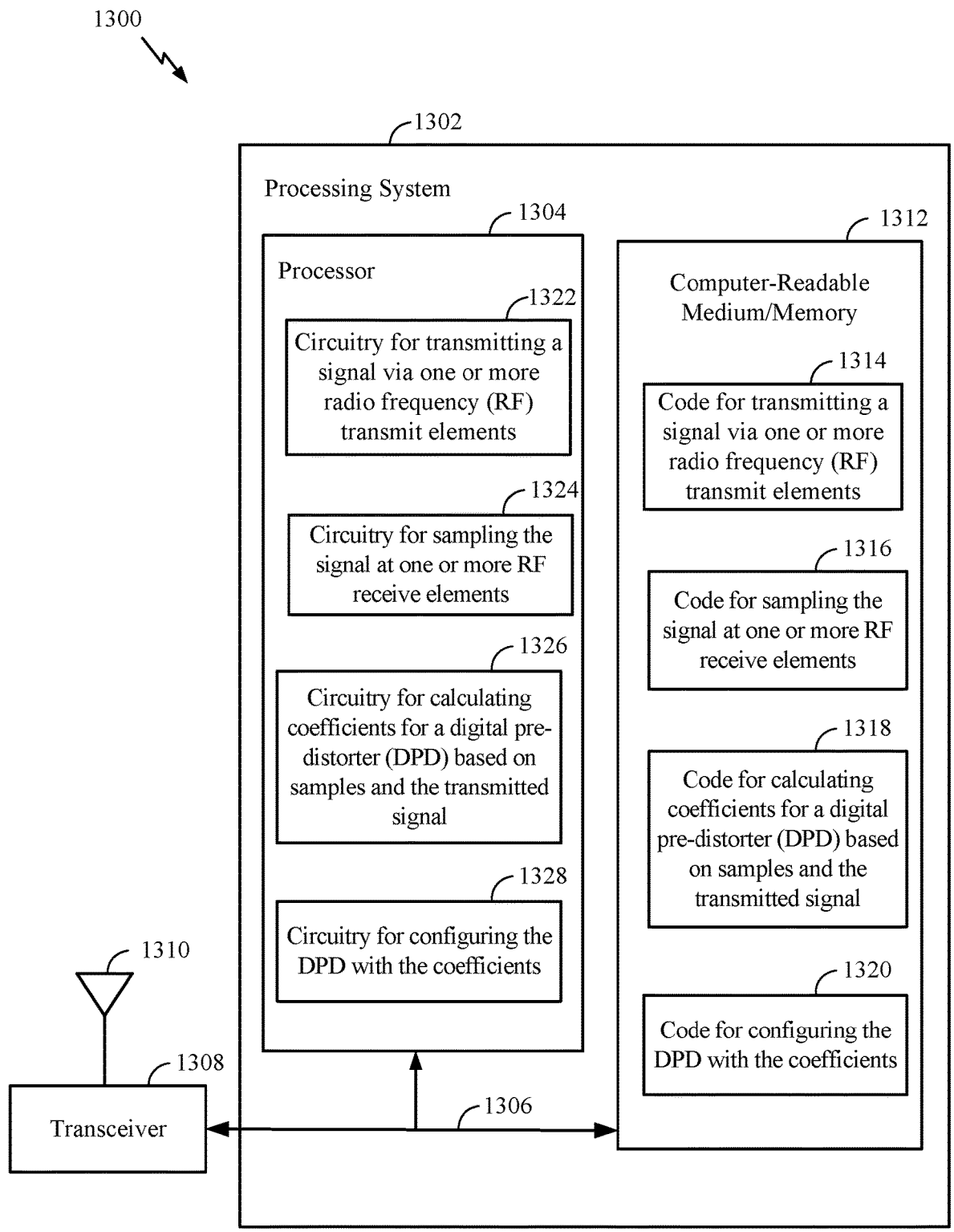
FIG. 13 illustrates a communications device that may include various components configured to perform operations for the techniques disclosed herein in accordance with aspects of the present disclosure.

FIG. 13 illustrates a communications device 1300 that may include various components (e.g., corresponding to means-plus-function components) configured to perform operations for the techniques disclosed herein, such as the operations illustrated in FIG. 7. The communications device 1300 includes a processing system 1302 coupled to a transceiver 1308 (e.g., a transmitter and/or a receiver). The transceiver 1308 is configured to transmit and receive signals for the communications device 1300 via an antenna 1310, such as the various signals as described herein. The processing system 1302 may be configured to perform processing functions for the communications device 1300, including processing signals received and/or to be transmitted by the communications device 1300.

The processing system 1302 includes a processor 1304 coupled to a computer-readable medium/memory 1312 via a bus 1306. In certain aspects, the computer-readable medium/memory 1312 is configured to store instructions (e.g., computer-executable code) that when executed by the processor 1304, cause the processor 1304 to perform the operations illustrated in FIG. 7, or other operations for performing the various techniques discussed herein for digital pre-distorter training. In certain aspects, computer-readable medium/memory 1312 stores code 1314 for transmitting a signal, generated by a transmitter front end, via one or more radio frequency (RF) transmit elements; code 1316 for sampling the signal, received over the air, at one or more RF receive elements, code 1318 for calculating coefficients for a digital pre-distorter (DPD) based on samples and the transmitted signal; and code 1320 for configuring the DPD with the coefficients, for use in digitally pre-distorting subsequent transmissions.

In certain aspects, the processor 1304 has circuitry configured to implement the code stored in the computer-readable medium/memory 1312. The processor 1304 includes circuitry 1322 for transmitting a signal, generated by a transmitter front end, via one or more radio frequency (RF) transmit elements; circuitry 1324 for sampling the signal, received over the air, at one or more RF receive elements; code 1326 for calculating coefficients for a digital pre-distorter (DPD) based on samples and the transmitted signal; and code 1328 for configuring the DPD with the coefficients, for use in digitally pre-distorting subsequent transmissions.

Example Aspects

Aspect 1: A method for wireless communication by an apparatus, comprising transmitting a signal, generated by a transmitter front end, via one or more radio frequency (RF) transmit elements; sampling the signal, received over the air, at one or more RF receive elements; calculating coefficients for a digital pre-distorter (DPD) based on samples and the transmitted signal; and configuring the DPD with the coefficients, for use in digitally pre-distorting subsequent transmissions.

Aspect 2: The method of Aspect 1, further comprising synchronizing samples of the transmitted signal and the samples of the received signal.

Aspect 3: The method of Aspect 2, further comprising generating the samples of the transmitted signal using a logger of the transmitter front end.

Aspect 4: The method of Aspect 3, wherein the transmitted signal comprises a wireless standards-compliant signal.

Aspect 5: The method of any of Aspects 1-4, wherein generating the coefficients comprises estimating time-domain coefficients of an over-the-air linear channel between the one or more RF transmit elements and the one or more RF receive elements; and performing a time-domain linear equalization to remove the over-the-air linear channel.

Aspect 6: The method of any of Aspects 1-5, further comprising updating a digital gain based on the configured DPD with the DPD coefficients to match power of a signal without DPD.

Aspect 7: The method of any of Aspects 1-6, wherein a first port of the apparatus comprises the one or more RF transmit elements.

Aspect 8: The method of Aspect 7, wherein a second port comprises the one or more RF receive elements.

Aspect 9: The method of Aspect 7 or 8, wherein the first port comprises the one or more RF receive elements.

Aspect 10: The method of any of Aspects 1-9, wherein the one or more RF transmit elements comprises one or more horizontal elements and the one or more RF receive elements comprises one or more vertical elements; or the one or more RF receive elements comprises one or more horizontal elements and the one or more RF transmit elements comprises one or more vertical elements.

Aspect 11: The method of any of Aspects 1-10, further comprising selecting a pair including one of the RF transmit elements for transmitting the signal; and one of the RF receive elements for sampling the signal.

Aspect 12: The method of Aspect 11, wherein the selection is based on an evaluation of multiple pairs of RF transmit and RF receive elements.

Aspect 13: The method of Aspect 1, further comprising performing linear over-the-air channel estimation and equalization on the samples of the received signal.

Aspect 14: An apparatus, comprising: a memory comprising executable instructions; and one or more processors configured to execute the executable instructions and cause the apparatus to perform a method in accordance with any one of Aspects 1-13.

Aspect 15: An apparatus, comprising means for performing a method in accordance with any one of Aspects 1-13.

Aspect 16: A non-transitory computer-readable medium comprising executable instructions that, when executed by one or more processors of an apparatus, cause the apparatus to perform a method in accordance with any one of Aspects 1-13.

Aspect 17: A computer program product embodied on a computer-readable storage medium comprising code for performing a method in accordance with any one of Aspects 1-13.

Additional Considerations

The preceding description provides examples of utilizing physical resource blocks (PRBs) that do not belong to a sub-channel in sidelink, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as 5G (e.g., 5g NR), 3GPP Long Term Evolution (LTE), code division multiple access (CDMA), time division multiple access (TDMA), frequency division multiple access (FDMA), orthogonal frequency division multiple access (OFDMA), single-carrier frequency division multiple access (SC-FDMA), time division synchronous code division multiple access (TD-SCDMA), and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

LTE and LTE-A are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). NR is an emerging wireless communications technology under development.

NR access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components. For example, various operations shown in FIG. 14 may be performed by various processors shown in FIG. 4, such as processors 466, 458, 464, and/or controller/processor 480 of the UE 120a.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-Ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations described herein and illustrated in FIG. 14.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method for wireless communication by an apparatus, comprising:
    transmitting a signal, generated by a transmitter front end, via one or more radio frequency (RF) transmit elements;
    sampling the signal, received over the air, at one or more RF receive elements, wherein:
        the one or more RF transmit elements comprises one or more horizontal element and the one or more RF receive elements comprises one or more vertical elements; or
        the one or more RF receive elements comprises one or more horizontal elements and the one or more RF transmit elements comprises one or more vertical elements;
    calculating coefficients for a digital pre-distorter (DPD) based on samples and the transmitted signal; and
    configuring the DPD with the coefficients, for use in digitally pre-distorting subsequent transmissions.

2. The method of claim 1, further comprising synchronizing samples of the transmitted signal and the samples of the received signal.

3. The method of claim 2, further comprising generating the samples of the transmitted signal using a logger of the transmitter front end.

4. The method of claim 3, wherein the transmitted signal comprises a wireless standards-compliant signal.

5. The method of claim 1, wherein generating the coefficients comprises:
    estimating time-domain coefficients of an over-the-air linear channel between the one or more RF transmit elements and the one or more RF receive elements; and
    performing a time-domain linear equalization to remove the over-the-air linear channel.

6. The method of claim 1, further comprising updating a digital gain based on the configured DPD with the DPD coefficients to match power of a signal without DPD.

7. The method of claim 1, wherein:
    a first port of the apparatus comprises the one or more RF transmit elements.

8. The method of claim 7, wherein a second port comprises the one or more RF receive elements.

9. The method of claim 7, wherein the first port comprises the one or more RF receive elements.

10. The method of claim 1, further comprising selecting a pair including:
    one of the RF transmit elements for transmitting the signal; and
    one of the RF receive elements for sampling the signal.

11. The method of claim 10, wherein the selection is based on an evaluation of multiple pairs of RF transmit and RF receive elements.

12. The method of claim 1, further comprising performing linear over-the-air channel estimation and equalization on the samples of the received signal.

13. An apparatus for wireless communication, comprising:
    at least one processor; and
    memory coupled to the at least one processor, the memory comprising code executable by the at least one processor to cause the apparatus to:
        transmit a signal, generated by a transmitter front end, via one or more radio frequency (RF) transmit elements;
        sample the signal, received over the air, at one or more RF receive elements, wherein:
            the one or more RF transmit elements comprises one or more horizontal elements and the one or more RF receive elements comprises one or more vertical elements; or
            the one or more RF receive elements comprises one or more horizontal elements and the one or more RF transmit elements comprises one or more vertical elements;
        calculate coefficients for a digital pre-distorter (DPD) based on samples and the transmitted signal; and
        configure the DPD with the coefficients, for use in digitally pre-distorting subsequent transmissions.

14. The apparatus of claim 13, wherein the memory further comprises code executable by the at least one processor to cause the apparatus to synchronize samples of the transmitted signal and the samples of the received signal.

15. The apparatus of claim 14, wherein the memory further comprises code executable by the at least one processor to cause the apparatus to generate the samples of the transmitted signal using a logger of the transmitter front end.

16. The apparatus of claim 15, wherein the transmitted signal comprises a wireless standards-compliant signal.

17. The apparatus of claim 13, wherein generating the coefficients comprises:
- estimating time-domain coefficients of an over-the-air linear channel between the one or more RF transmit elements and the one or more RF receive elements; and
- performing a time-domain linear equalization to remove the over-the-air linear channel.

18. The apparatus of claim 13, wherein the memory further comprises code executable by the at least one processor to cause the apparatus to update a digital gain based on the configured DPD with the DPD coefficients to match power of a signal without DPD.

19. The apparatus of claim 13, wherein:
- a first port of the apparatus comprises the one or more RF transmit elements.

20. The apparatus of claim 19, wherein a second port comprises the one or more RF receive elements.

21. The apparatus of claim 19, wherein the first port comprises the one or more RF receive elements.

22. The apparatus of claim 13, wherein the memory further comprises code executable by the at least one processor to cause the apparatus to select a pair including:
- one of the RF transmit elements for transmitting the signal; and
- one of the RF receive elements for sampling the signal.

23. The apparatus of claim 22, wherein the selection is based on an evaluation of multiple pairs of RF transmit and RF receive elements.

24. The apparatus of claim 13, wherein the memory further comprises code executable by the at least one processor to cause the apparatus to perform linear over-the-air channel estimation and equalization on the samples of the received signal.

25. An apparatus for wireless communication, comprising:
- means for transmitting a signal, generated by a transmitter front end, via one or more radio frequency (RF) transmit elements;
- means for sampling the signal, received over the air, at one or more RF receive elements, wherein:
  - the one or more RF transmit elements comprises one or more horizontal elements and the one or more RF receive elements comprises one or more vertical elements; or
  - the one or more RF receive elements comprises one or more horizontal elements and the one or more RF transmit elements comprises one or more vertical elements;
- means for calculating coefficients for a digital pre-distorter (DPD) based on samples and the transmitted signal; and
- means for configuring the DPD with the coefficients, for use in digitally pre-distorting subsequent transmissions.

26. A non-transitory computer readable medium having instructions stored thereon for:
- transmitting a signal, generated by a transmitter front end, via one or more radio frequency (RF) transmit elements;
- sampling the signal, received over the air, at one or more RF receive elements, wherein:
  - the one or more RF transmit elements comprises one or more horizontal elements and the one or more RF receive elements comprises one or more vertical elements; or
  - the one or more RF receive elements comprises one or more horizontal elements and the one or more RF transmit elements comprises one or more vertical elements;
- calculating coefficients for a digital pre-distorter (DPD) based on samples and the transmitted signal; and
- configuring the DPD with the coefficients, for use in digitally pre-distorting subsequent transmissions.

\* \* \* \* \*